(12) United States Patent
Wang et al.

(10) Patent No.: US 12,744,499 B2
(45) Date of Patent: Sep. 22, 2026

(54) RADIO FREQUENCY DEVICE APPLIED IN PHASED ARRAY ANTENNA WITH POWER DETECTION AND CALIBRATION, SEMICONDUCTOR DEVICE AND METHOD THEREOF

(71) Applicant: TRON FUTURE TECH INC., Hsinchu City (TW)

(72) Inventors: Yu-Jiu Wang, Hsinchu City (TW); Yue Ming Wu, Hsinchu City (TW); Hao-Chung Chou, Hsinchu City (TW); Ta-Shun Chu, Hsinchu City (TW)

(73) Assignee: TRON FUTURE TECH INC., Hsinchu City (TW)

( * ) Notice: Subject to any disclaimer, the term of this patent is extended or adjusted under 35 U.S.C. 154(b) by 639 days.

(21) Appl. No.: 18/318,321

(22) Filed: May 16, 2023

(65) Prior Publication Data

US 2024/0283417 A1 Aug. 22, 2024

Related U.S. Application Data

(60) Provisional application No. 63/485,969, filed on Feb. 20, 2023.

(51) Int. Cl.
*H03F 3/24* (2006.01)
*H03G 3/30* (2006.01)

(52) U.S. Cl.
CPC ........... *H03F 3/245* (2013.01); *H03G 3/3042* (2013.01); *H03F 2200/105* (2013.01); *H03F 2200/451* (2013.01); *H03G 2201/10* (2013.01); *H03G 2201/307* (2013.01)

(58) Field of Classification Search
None
See application file for complete search history.

(56) References Cited

U.S. PATENT DOCUMENTS 7,546,137 B2 * 6/2009 D'Hont ................ G06K 7/0008 370/282
8,538,354 B2 * 9/2013 Xu ....................... H03G 3/3047 330/85

(Continued)

FOREIGN PATENT DOCUMENTS

CN 114428185 A 5/2022

OTHER PUBLICATIONS

English translation of CN 114428185.

(Continued)

*Primary Examiner* — Andrea Lindgren Baltzell
*Assistant Examiner* — Malane Lieng
(74) *Attorney, Agent, or Firm* — WPAT, P.C.; Anthony King

(57) ABSTRACT

The present application discloses a radio frequency (RF) device. The radio frequency device includes a power amplifier, a power detector, and a digital signal processor (DSP). The power amplifier outputs a RF signal. The power detector receives the RF signal, and performs a plurality of calibration operations to generate a plurality of calibration voltages corresponding to a plurality of bias voltage, wherein the calibration operations are performed at the bias voltages respectively, and the calibration voltages are temperature-correlated due to that electrical characteristics of the power detector are temperature-correlated. The DSP controls the power detector to operate at the bias voltages, obtains an index voltage for indicating power of the RF signal by performing calculations upon the calibration voltages to reduce temperature dependency of the index voltage, and adjusts a gain of the power amplifier according to the index voltage.

20 Claims, 8 Drawing Sheets

(56) References Cited

U.S. PATENT DOCUMENTS

| | | | | |
|---|---|---|---|---|
| 8,725,105 B2 * | 5/2014 | Tsai | H04B 1/109 | 455/341 |
| 8,874,050 B1 * | 10/2014 | Hietala | H03F 3/24 | 330/281 |
| 11,689,163 B2 * | 6/2023 | Samelis | H03F 1/0238 | 330/297 |
| 2010/0227578 A1 * | 9/2010 | Chan | H03F 1/34 | 455/127.2 |

OTHER PUBLICATIONS

Office action of the Taiwan family patent application 113101762 dated May 31, 2024.
English abstract translation of the office action of the Taiwan family patent application 113101762 dated May 31, 2024.
Mjun Zhou, Yan Wah, M. C. (n.d.). A wide band CMOS RF Power Detector. 2006 IEEE International Symposium on Circuits and Systems. https://doi.org/10.1109/iscas.2006.1693562.
Sakphrom, S., & Thanachayanont, A. (2012). A low-power CMOS RF power detector. 2012 19th IEEE International Conference on Electronics, Circuits, and Systems (ICECS 2012). https://doi.org/10.1109/icecs.2012.6463771.
Bhagavatula, V., Zhang, F., Kuo, C., Sarkar, A., Verma, A., Chang, T., Yu, X., Yoon, D.-Y., Lu, I. S.-C., Son, S. W., Cho, T. B. (2022). A 5G FR2 power-amplifier with an integrated power-detector for closed-loop EIRP control. IEEE Journal of Solid-State Circuits, 57(5), 1257-1266. https://doi.org/10.1109/jssc.2022.3146872.

* cited by examiner

RADIO FREQUENCY DEVICE APPLIED IN PHASED ARRAY ANTENNA WITH POWER DETECTION AND CALIBRATION, SEMICONDUCTOR DEVICE AND METHOD THEREOF

CROSS REFERENCE

This application claims the benefit of prior-filed U.S. provisional application No. 63/485,969, filed on Feb. 20, 2023, which is incorporated by reference in its entirety.

TECHNICAL FIELD

The present disclosure relates to a radio frequency device, and more particularly, to a radio frequency device includes a power detector.

DISCUSSION OF THE BACKGROUND

In modern wireless communication technologies, satellite communications has become competitive for it provides better signal coverage and higher bandwidth as compared to conventional terrestrial communication technologies. To achieve the satellite communications, large-scale phased-array antenna that can achieve beamforming and high power gain is demanded. Furthermore, to achieve beamforming with accurate beam steering, the power of RF signal outputted from the transmitter chip must be controlled precisely, and thus, accurate power detection is also required. However, since power detectors for detecting the RF signal power usually have temperature-correlated characteristics, the detection results are also affected by the temperature variance. Therefore, there is a need to develop a power detection method or a power detector that can reduce temperature dependency of the detected power and improve the accuracy.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a radio frequency (RF) device. The RF device includes a power amplifier, a power detector, and a digital signal processor (DSP). The power amplifier is configured to output a radio frequency (RF) signal. The power detector is configured to receive the RF signal, and perform a plurality of calibration operations to generate a plurality of calibration voltages corresponding to a plurality of bias voltage. The calibration operations are performed at the plurality of bias voltages respectively, and the plurality of calibration voltages are temperature-correlated due to that electrical characteristics of the power detector are temperature-correlated. The digital signal processor (DSP) is configured to control the power detector to operate at the plurality of bias voltages, obtain an index voltage for indicating power of the RF signal by performing calculations upon the plurality of calibration voltages to reduce temperature dependency of the index voltage, and adjust a gain of the power amplifier according to the index voltage.

Another aspect of the present disclosure provides a semiconductor device. The semiconductor device includes a power amplifier, and a power detector. The power amplifier is configured to output a radio frequency (RF) signal. The power detector is configured to receive the RF signal, and perform a plurality of calibration operations to generate a plurality of calibration voltages corresponding to a plurality of bias voltage. The calibration operations are performed at the plurality of bias voltages respectively, and the plurality of calibration voltages are temperature-correlated due to that electrical characteristics of the power detector are temperature-correlated. The calibration voltages are configured to calculate an index voltage for indicating power of the RF signal and reduce temperature dependency of the index voltage.

Another aspect of the present disclosure provides a method for detecting power of a radio frequency signal with a power detector. The method includes controlling the power detector to perform a plurality of calibration operations for generating a plurality of calibration voltages according to the RF signal and a plurality of bias voltage. The plurality of calibration voltages are temperature-correlated due to that electrical characteristics of the power detector are temperature-correlated. The method further includes obtaining an index voltage for indicating power of the RF signal by performing calculations upon the plurality of calibration voltages to reduce temperature dependency of the index voltage, and adjusting a gain of the power amplifier according to the index voltage. The calibration operations are performed at the plurality of bias voltages respectively.

The RF device, the semiconductor device, and the method for detecting power of a RF signal provided by the embodiments of the present disclosure can perform a plurality of calibration operations to generate calibration voltages, and calculate the index voltage for indicating the power of the RF signal by performing calculations upon the calibration voltages to reduce temperature dependency. Therefore, temperature-correlated portions in the index voltage can be reduced, and thus, the power of RF signals can be monitored and controlled more accurately.

BRIEF DESCRIPTION OF THE DRAWINGS

A more complete understanding of the present disclosure may be derived by referring to the detailed description and claims when considered in connection with the Figures, where like reference numbers refer to similar elements throughout the Figures.

DETAILED DESCRIPTION

The following description of the disclosure accompanies drawings, which are incorporated in and constitute a part of this specification, and which illustrate embodiments of the disclosure, but the disclosure is not limited to the embodiments. In addition, the following embodiments can be properly integrated to complete another embodiment.

References to "one embodiment," "an embodiment," "exemplary embodiment," "other embodiments," "another embodiment," etc. indicate that the embodiment(s) of the disclosure so described may include a particular feature, structure, or characteristic, but not every embodiment necessarily includes the particular feature, structure, or characteristic. Further, repeated use of the phrase "in the embodiment" does not necessarily refer to the same embodiment, although it may.

In order to make the present disclosure completely comprehensible, detailed steps and structures are provided in the following description. Obviously, implementation of the present disclosure does not limit special details known by persons skilled in the art. In addition, known structures and steps are not described in detail, so as not to unnecessarily limit the present disclosure. Preferred embodiments of the present disclosure will be described below in detail. However, in addition to the detailed description, the present disclosure may also be widely implemented in other embodiments. The scope of the present disclosure is not limited to the detailed description, and is defined by the claims.

Figure 1:
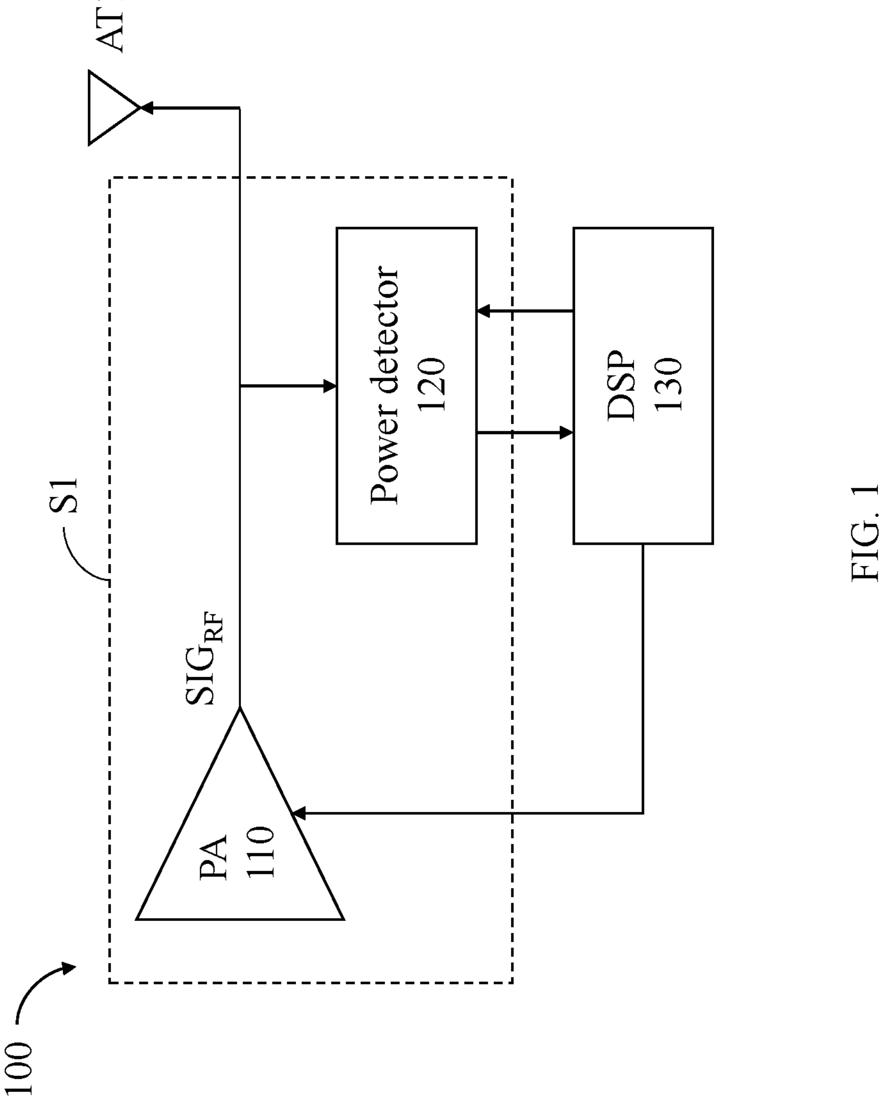
FIG. 1 shows a radio frequency device according to one embodiment of the present disclosure.

FIG. 1 shows a radio frequency (RF) device 100 according to one embodiment of the present disclosure. The RF device 100 includes a power amplifier 110, a power detector 120, and a digital signal processor (DSP) 130. In the present embodiment, the RF device 100 can be adopted in a phased array radar system as a transmitter for controlling an antenna therein. For example, as shown in FIG. 1, the power amplifier 110 can output a RF signal $SIG_{RF}$ to the antenna AT1 for wireless communication. In FIG. 1, the power amplifier 110 and the power detector 120 can be embedded in a semiconductor device S1, such as a chip or a die.

Furthermore, to ensure the power of the RF signal $SIG_{RF}$ transmitted to the antenna AT1 is within a targeted range, the power detector 120 can assist the DSP 130 to detect the power of the RF signal $SIG_{RF}$ so that the DSP 130 can control the power amplifier 110 and adjust the gain of the power amplifier 110. As a result, the power of the RF signal $SIG_{RF}$ can be monitored and controlled within the targeted range.

However, since the electrical characteristics of the power detector 120 are temperature-correlated, the result of power detection performed with the power detector 120 may also be affected by temperature variance. That is, without special care, the power detection performed with the power detector 120 may become inaccurate as the temperature of the power detector 120 changes. In some cases, the temperature may change due to the increasing or decreasing of the light receiving area as the sun moves or due to the heat generated by the RF device 100 itself during operations.

Figure 2:
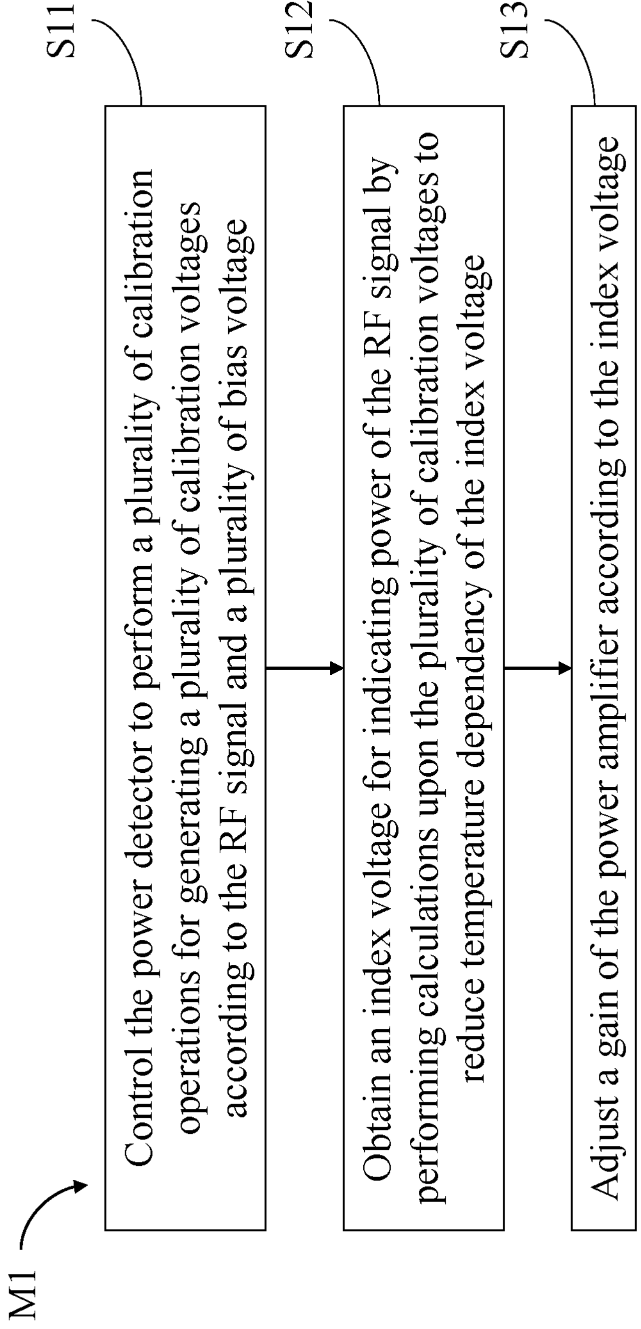
FIG. 2 shows a method for detecting power of a radio frequency signal with a power detector according to one embodiment of the present disclosure.

FIG. 2 shows a method M1 for detecting power of the radio frequency signal $SIG_{RF}$ with the power detector 120. The method M1 includes steps S110 to S130. In some embodiments, the method M1 can be, for example but not limited to, performed by the DSP 130. In such case, the DSP 130 may control the power detector 120 to perform a series of calibration operations to generate a plurality calibration voltages (S110), and can obtain an index voltage used for indicating the power of the RF signal $SIG_{RF}$ by performing calculations upon the calibration voltages (S120). By performing the calibration operations with properly determined bias voltages in the power detector 120, temperature-correlated portions in the calibration voltages can be canceled out during the calculation. Therefore, the index voltage derived from the calculation of the calibration voltages can be less temperature dependent, and thus, the accuracy of the power detection can be improved. As a result, the DSP 130 can adjust the gain of the power amplifier 110 more precisely (S130).

Figure 3:
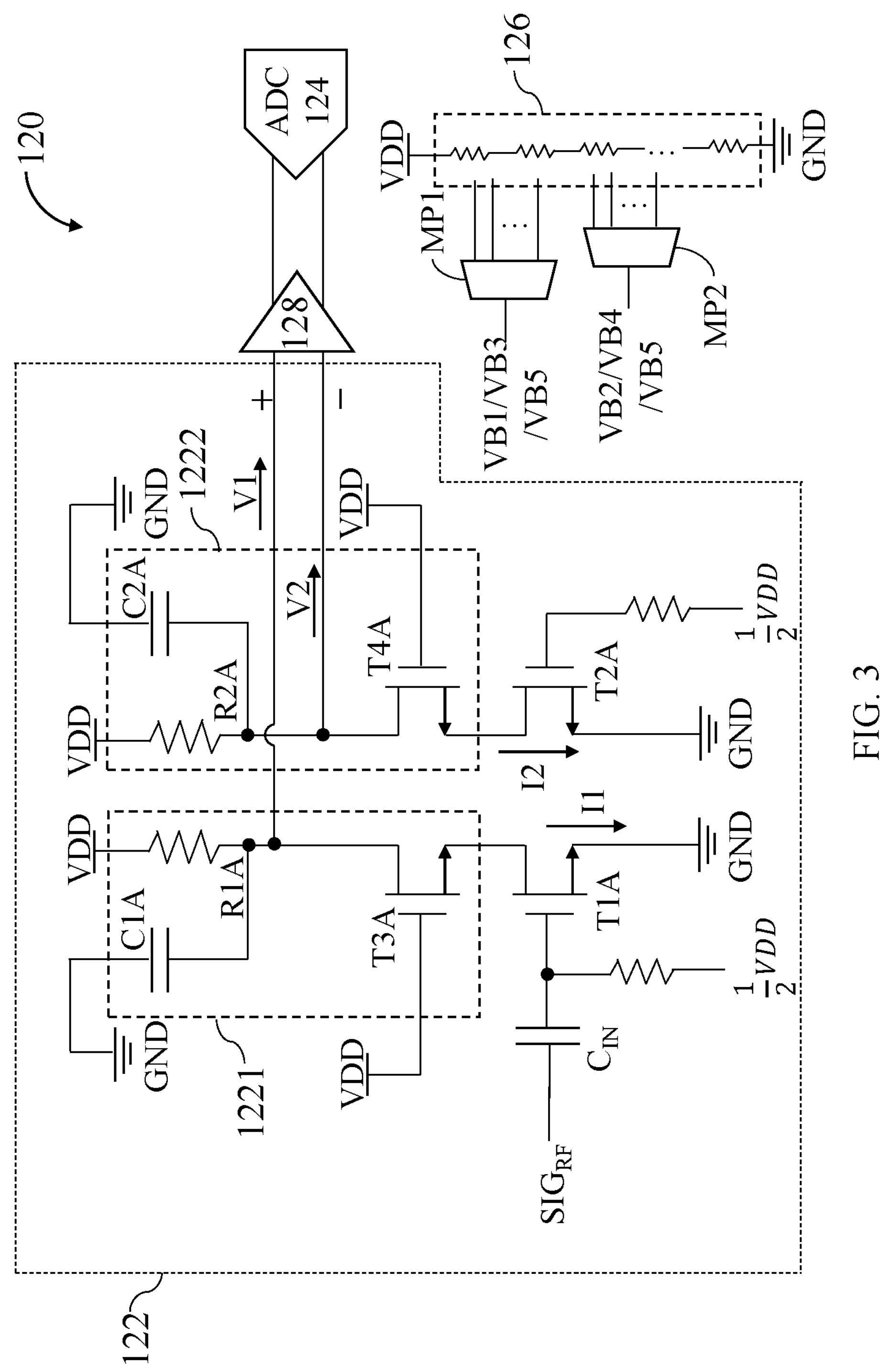
FIG. 3 shows the power detector in FIG. 1 according to one embodiment of the present disclosure.

FIG. 3 shows the power detector 120 according to one embodiment of the present disclosure. The power detector 120 includes a detect circuit 122. The detect circuit 122 includes input transistors T1A, T2A, and load units 1221, 1222. As shown in FIG. 3, the load unit 1221 can be coupled to the input transistor T1A, and can convert a current on the input transistor T1A into a voltage signal. Similarly, the load unit 1222 can be coupled to the input transistor T2A, and can convert a current on the input transistor T2A into a voltage signal.

In the present embodiment, the load unit 1221 can include a load transistor T3A, a resistor R1A, and a capacitor C1A, and the load unit 1222 can include a load transistor T4A, a resistor R2A, and a capacitor C2A. The load units 1221 and 1222 can have same structures and can be operated with same principles. As shown in FIG. 3, the load transistor T3A has a first terminal for outputting voltages, a second terminal coupled to a first terminal of the input transistor T1A, and a control terminal for receiving a supply voltage VDD. The resistor R1A has a first terminal for receiving the supply voltage VDD, and a second terminal coupled to the first terminal of the load transistor T1A. The capacitor C1A has a first terminal coupled to the ground GND, and a second terminal coupled to the second terminal of the first resistor R1A. In addition, in the present embodiments, the second terminals of the input transistors T1A and T2A can be coupled to the ground GND.

In some embodiments, without calibration, the detect circuit 122 may be used to generate the index voltage for indicating the power of the RF signal $SIG_{RF}$ directly. For example, as shown in FIG. 3, if the control terminals of the transistors T1A and T2A receives a same bias voltage of $$\frac{1}{2}VDD,$$

with the control terminal of the transistor T1A further receiving the RF signal $SIG_{RF}$ through an input capacitor $C_{IN}$. The currents I1 and I2 on the transistors T1A and T2A can be represented by formulas (1) and (2) below.

$$I1 = \frac{1}{2}\mu_n C_{ox}\frac{W}{L}\left(\frac{1}{2}VDD - V_{th} + V_{RF}\cos\omega t^2\right) \tag{1}$$

$$I2 = \frac{1}{2}\mu_n C_{ox}(1+K)\frac{W}{L}\left(\frac{1}{2}VDD - V_{th}\right) \tag{2}$$

In formulas (1) and (2), $\mu_n$ represents the electron mobility of the transistors T1A and T2A, and $C_{ox}$ represents the oxide capacitance per unit area, $V_{th}$ represents the threshold voltage of the transistor T1A and T2A. $V_{RF}$ represents the root-mean-square voltage of the RF signal $SIG_{RF}$. In the present embodiment, $V_{RF}$ can be adopted as the index voltage for indicating the power of the RF signal $SIG_{RF}$. In addition, ω represents the frequency of the RF signal $SIG_{RF}$. W represents the channel width of the transistor T1A, L represents the channel length of the transistor T1A. Furthermore, due to the size variation among transistors, the channel length and channel width of the transistor T2A may be different from that of the transistor T1A. In the present embodiment, K represents a size variation between the transistors T2A and the transistor T1A.

In such case, the output voltages V1 and V2 outputted by the load unit 1221 and the load unit 1222 through the second terminals of the load transistors T3A and T4A can be represented by formulas (3) and (4).

$$V1 = \frac{1}{2} R\mu_n C_{ox} \frac{W}{L} \left(\frac{1}{2} VDD - V_{th} + V_{RF} \cos \omega t\right)^2 \tag{3}$$

$$V2 = \frac{1}{2} R\mu_n C_{ox} (1+K) \frac{W}{L} \left(\frac{1}{2} VDD - V_{th}\right)^2 \tag{4}$$

In formulas (3) and (4), R represents the resistance of the resistors R1A and R2A. In such case, the index voltage $V_{RF}$ can be derived from the output voltage V1 and V2. As shown in FIG. 3, the output voltages V1 and V2 can be outputted as a differential pair, and the power detector 120 may further include an analog to digital converter 124 for converting the differential voltage of the output voltages V1 and V2. Furthermore, a buffer or an amplifier 128 may be adopted to amplify the output voltages V1 and V2 before the analog to digital conversion.

Although the index voltage $V_{RF}$ can be derived from the differential voltage of the output voltages V1 and V2, it may also be noticed that, since the electron mobility $\mu_n$ and the threshold voltage $V_{th}$ are temperature-correlated, the index voltage $V_{RF}$ derived from the output voltage V1 and V2 will also suffer from the temperature variation. Furthermore, since the channel widths and the channel lengths of the transistors T1A and T2A may be different due to uncontrollable factors during the manufacturing process, the index voltage $V_{RF}$ derived from the output voltage V1 and V2 will also related to the size variation.

To address such issues, instead of calculate the index voltage $V_{RF}$ directly from the output voltage V1 and V2, a plurality of calibration operations can be performed so that portions in the calculated index voltage $V_{RF}$ that are temperature-correlated and size-correlated can be reduced.

In the present embodiment, the calibration operations can be performed in different periods. During each calibration operation, the DSP 130 can control the power detector 120 to provide corresponding bias voltages to the control terminals of the input transistors T1A and T2A. Correspondingly, the currents flowing through the transistors T1A and T2A would be adjusted according to the bias voltages, and the voltage outputted by the load units 1221 and 122B would also be adjusted accordingly. In the present embodiment, in each calibration operation, the detect circuit 122 can output a calibration voltage by outputting the output voltages of the load units 1221 and 122B as a differential pair.

FIGS. 4A to 4D shows bias voltages received by the power detector 120 during four calibration operations according to one embodiment of the present disclosure.

Figure 4A:
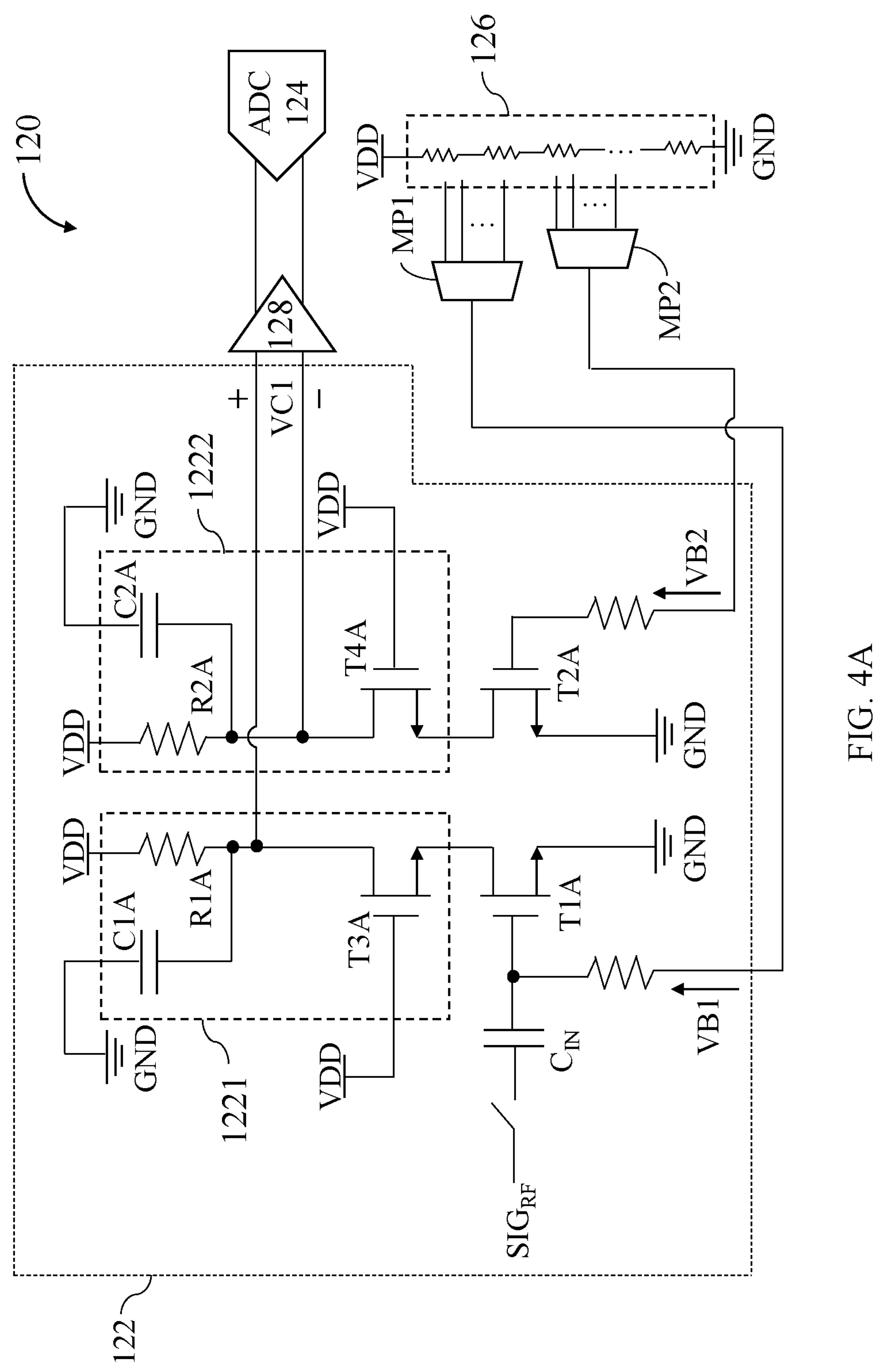
FIGS. 4A to 4D shows bias voltages received by the power detector in FIG. 3 during calibration operations according to one embodiment of the present disclosure.
Figure 4B:
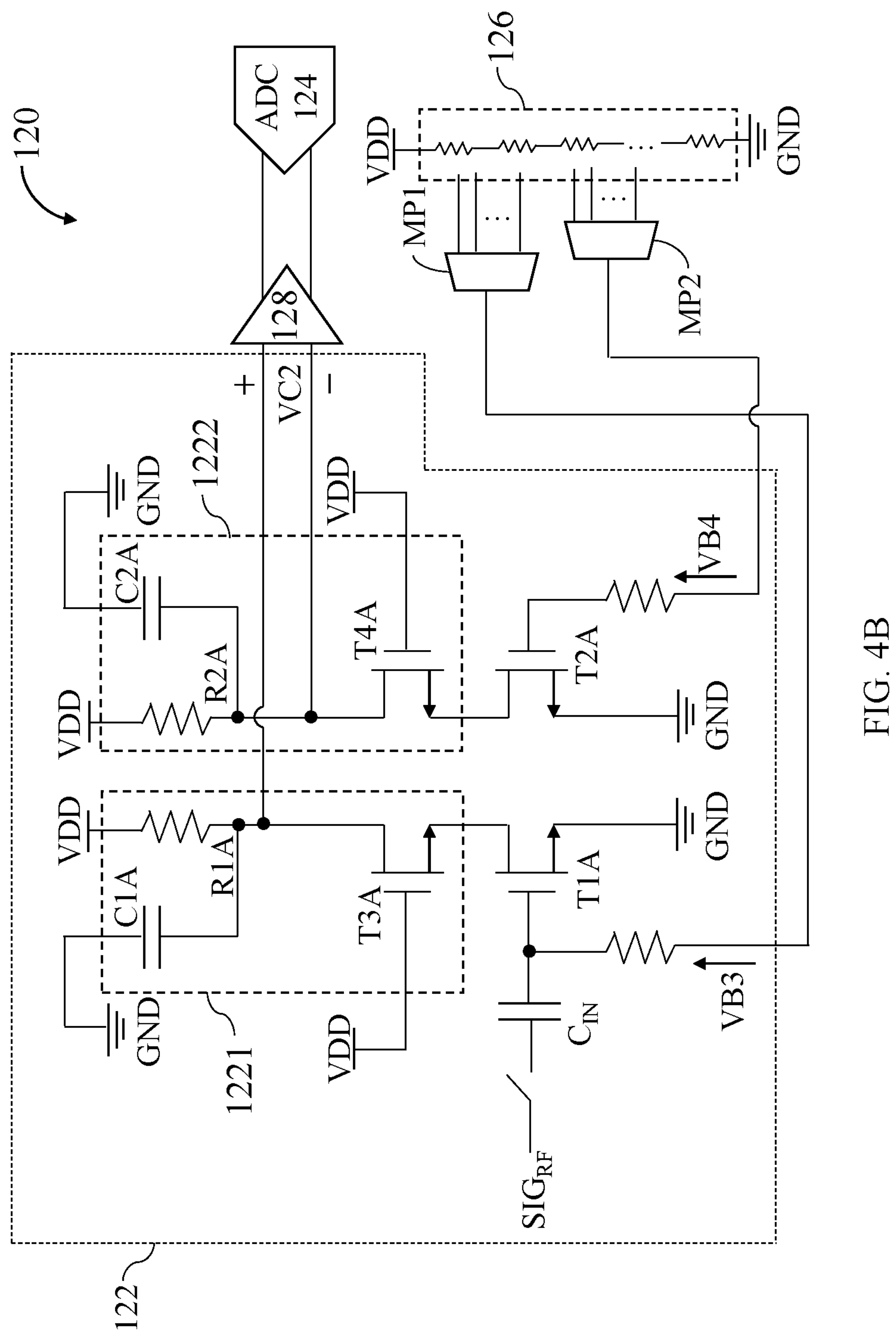
Figure 4C:
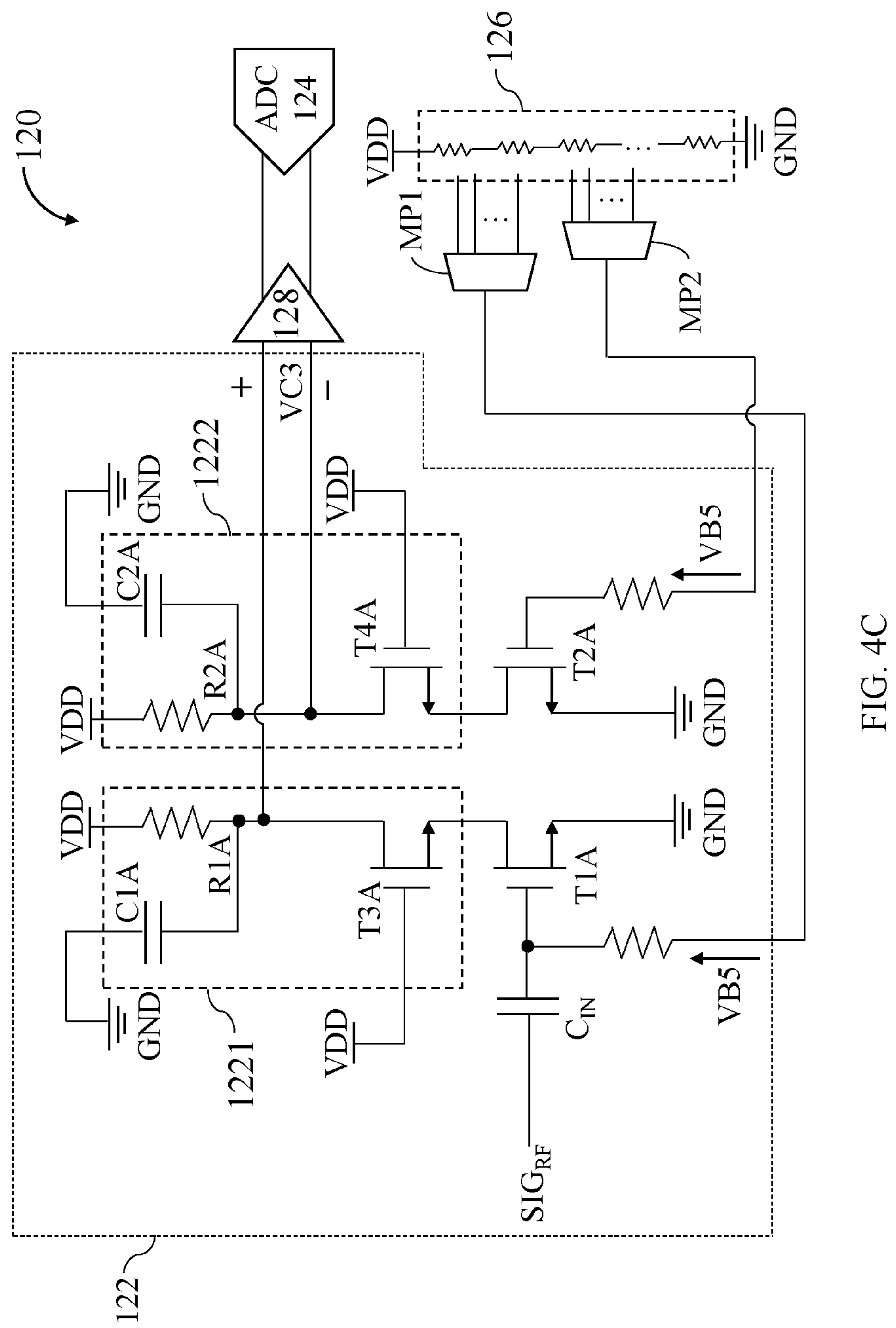

In the calibration operation shown in FIG. 4A, the power detector 120 may provide a first bias voltage VB1 to the control terminal of the transistor T1A, and provide a second bias voltage VB2 to the control terminal of the transistor T2A. In the calibration operation shown in FIG. 4B, the power detector 120 may provide a third bias voltage VB3 to the control terminal of the transistor T1A, and provide a fourth bias voltage VB4 to the control terminal of the transistor T2A. In the calibration operation shown in FIG. 4C, the power detector 120 may provide a fifth bias voltage VB5 to the control terminals of the transistors T1A and T2A, and have the control terminal of the transistor 1221 receives the RF signal $SIG_{RF}$ outputted from the power amplifier 110. Furthermore, in the calibration operation shown in FIG. 4D, the fifth bias voltage VB5 can be provided again to the control terminals of the transistors T1A and T2A. However, in the calibration operation shown in FIG. 4D, the RF signal $SIG_{RF}$ is not provided to the control terminal of the transistor 1221.

In the present embodiments, to reduce the temperature-correlated portions and the size-correlated portions in the index voltage $V_{RF}$, the bias voltages VB1 to VB5 should be assigned with special care. That is, the bias voltages VB1 to VB5 should be determined before step 120 by satisfying the condition that allows terms related to the threshold voltage $V_{th}$ and electron mobility $\mu_n$ of the input transistor T1A or T2A in the calibration voltages to be canceled out when obtaining the index voltage $V_{RF}$.

In the present embodiment, to satisfy such condition, the difference between the first bias voltage VB1 and the second bias voltage VB2 should be equal to a difference between the third bias voltage VB3 and the fourth bias voltage VB4. Also, a summation of the first bias voltage VB1 and the second bias voltage VB2 should be different from a summation of the third bias voltage VB3 and the fourth bias voltage VB4. For example, the first bias voltage VB1 can be $$\frac{9}{16} VDD,$$

the second bias voltage VB2 can be $$\frac{8}{16} VDD,$$

the third bias voltage VB3 can be $$\frac{7}{16} VDD,$$

fourth bias voltage VB4 can be $$\frac{8}{16} VDD,$$

and the fifth bias voltage VB5 can be $$\frac{8}{16} VDD.$$

In such case, the calibration voltages VC1, VC2, VC3, and VC4 generated in the four calibration operations can be represented by formulas (5) to (8) respectively.

$$VC1 = \frac{1}{2} R\mu_n C_{ox} \frac{W}{L} \left[\frac{1}{256} VDD^2 - K\left(\frac{8}{16} VDD - V_{th}\right)^2 + \frac{1}{8} VDD\left(\frac{8}{16} VDD - V_{th}\right)\right] \tag{5}$$

-continued $$VC2=\frac{1}{2}R\mu_nC_{ox}\frac{W}{L}\left[\frac{1}{256}VDD^2-K\left(\frac{8}{16}VDD-V_{th}\right)^2-\frac{1}{8}VDD\left(\frac{8}{16}VDD-V_{th}\right)\right] \quad (6)$$

$$VC3=\frac{1}{2}R\mu_nC_{ox}\frac{W}{L}\left[\frac{1}{2}V_{RF}^2-K\left(\frac{8}{16}VDD-V_{th}\right)^2\right] \quad (7)$$

$$VC4=-\frac{1}{2}R\mu_nC_{ox}\frac{W}{L}\left(\frac{8}{16}VDD-V_{th}\right)^2 \quad (8)$$

In such case, the calibration voltages VC1, VC2, and VC3 can be represented by the calibration voltage VC4 for brevity as shown in formulas (9) to (11).

$$VC1=VC4+\frac{1}{2}R\mu_nC_{ox}\frac{W}{L}\left[\frac{1}{256}VDD^2+\frac{1}{8}VDD\left(\frac{8}{16}VDD-V_{th}\right)\right] \quad (9)$$

$$VC2=VC4+\frac{1}{2}R\mu_nC_{ox}\frac{W}{L}\left[\frac{1}{256}VDD^2-\frac{1}{8}VDD\left(\frac{8}{16}VDD-V_{th}\right)\right] \quad (10)$$

$$VC3=\frac{1}{2}R\mu_nC_{ox}\frac{W}{L}\frac{V_{RF}^2}{2}+VC4 \quad (11)$$

According to formulas (9) to (11), it can be observed that the size variation constant K and the threshold voltage $V_{th}$ shown in the calibration voltages VC3 and VC4 can be canceled out by subtracting the calibration voltage VC4 from the calibration voltage VC3. Also, the size variation constant K and the threshold voltage $V_{th}$ shown in the calibration voltages VC1 and VC2 can be canceled out by adding the calibration voltage VC1 to the calibration voltage VC2 and subtracting two times the calibration voltage VC4. Finally, since the electron mobility $\mu_n$ exists in all the calibration voltages VC1, VC2, VC3, and VC4, a division can be performed to cancel out such term. As a result, the index voltage $V_{RF}$ can be calculated by formula (12) as below.

$$V_{RF}=\sqrt{4\left(\frac{VDD}{16}\right)^2\frac{VC3-VC4}{VC1+VC2-2VC4}} \quad (12)$$

As a result, the index voltage $V_{RF}$ can be calculated without involving the temperature-correlated portions and size-correlated portions caused by the transistors T1A and T2A. Although the present disclosure has provided exemplary bias voltages for performing the calibration operations in FIGS. 4A to 4D, the present disclosure is not limited thereto. In some embodiments, with similar concepts aforementioned, the designer may assign different voltage values to the bias voltages VB1 to VB5, and can still calculate the index voltage $V_{RF}$ while reducing the temperature-variant and/or size variant portions.

As shown in FIGS. 4A to 4D, the power detector 120 further includes a voltage divider 126. The voltage divider 126 can generate the bias voltages VB1 to VB5 by dividing the supply voltage VDD of the power detector 120. In such case, the DSP 130 may control the bias voltages to be provided to the input transistors T1A and T2A by sending control signals to the multiplexers MP1 and MP2 that are coupled to the control terminal of the input transistors T1A and T2A.

Furthermore, in the present embodiment, the ADC 124 can convert the calibration voltages VC1, VC2, VC3, and VC4 into digital calibration voltages so as to allow the DSP 130 to calculate the index voltage $V_{RF}$ according to the digital calibration voltages directly. However, the present disclosure is not limited thereto. In some embodiments, the ADC 124 may be omitted in the power detector 120. In such case, the ADC 124 may be embedded to the DSP 130.

In the present embodiment, both the temperature-correlated portions and size-correlated portions in the index voltage $V_{RF}$ can be reduced. However, the present disclosure is not limited thereto. In some embodiments, since the temperature variation may affect the index voltage $V_{RF}$ relatively more significantly than the size variation does, the calibration operations may aim to reduce the temperature-correlated portion in the index voltage $V_{RF}$ in a higher priority, and may ignore the size-correlated portion in the index voltage $V_{RF}$. By reducing only the temperature-correlated portion, the number of calibration operations can be reduced, and thus, the derivation of the index voltage $V_{RF}$ can be simplified.

Figure 4D:
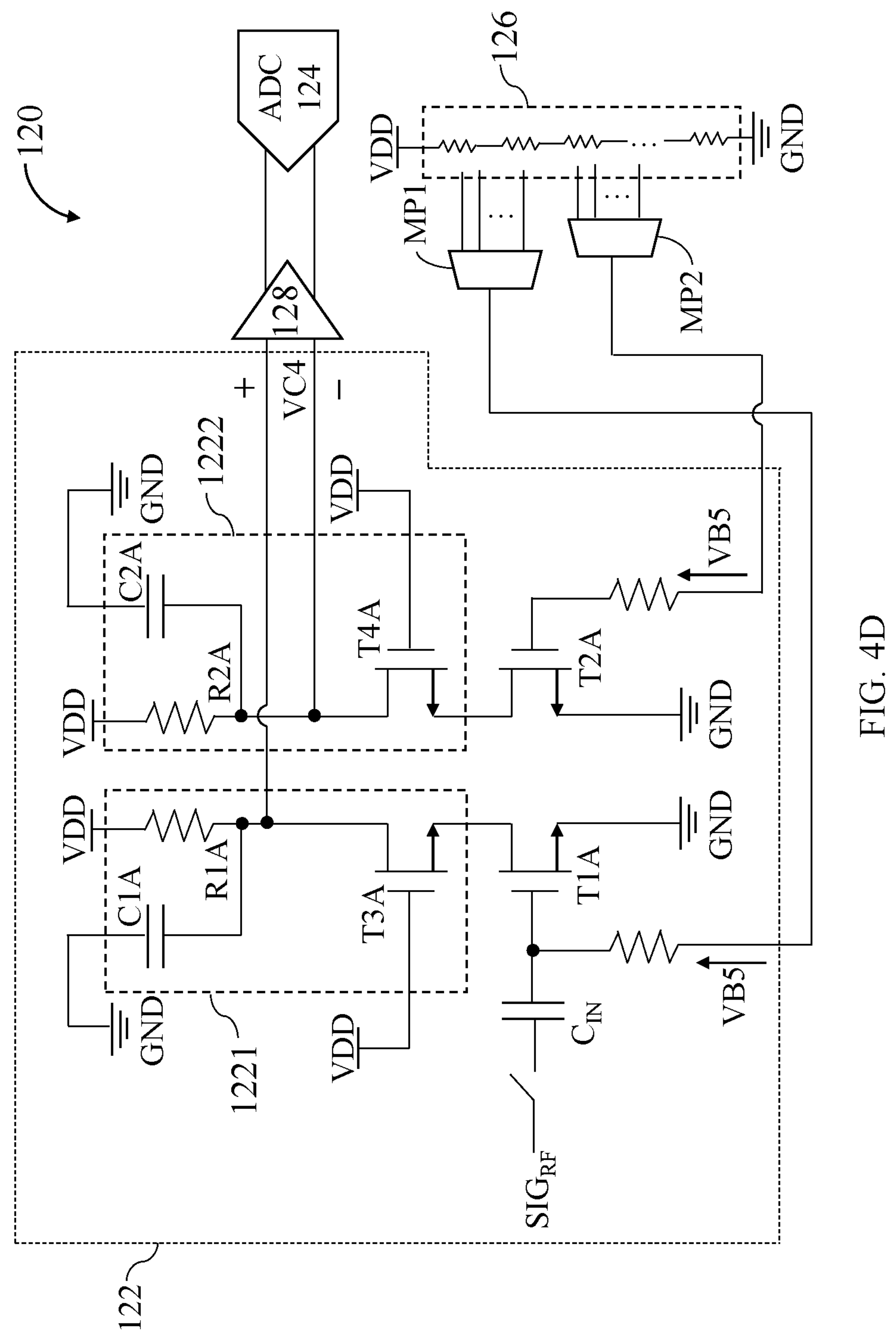

For example, in some embodiments, the calibration operations shown in FIG. 4D may be skipped. In such case, the three calibration operations in FIGS. 4A to 4C can be performed to reduce the temperature-correlated portion. Furthermore, different voltage values may be adopted for the bias voltages VB1 to VB5. For example, in the present embodiment, the first bias voltage VB1 can be $$\frac{7}{16}VDD,$$

the second bias voltage VB2 can be $$\frac{9}{16}VDD,$$

the third bias voltage VB3 can be $$\frac{4}{16}VDD,$$

fourth bias voltage VB4 can be $$\frac{6}{16}VDD,$$

and the fifth bias voltage VB5 can be $$\frac{8}{16}VDD.$$

In such case, calibration voltages VC1, VC2, and VC3 generated in the three calibration operations can be represented by formulas (13) to (15) respectively.

$$VC1=R\mu_nC_{ox}\frac{W}{L}\left(\frac{8}{16}VDD-V_{th}\right)\frac{2}{16}VDD \quad (13)$$

$$VC1=R\mu_nC_{ox}\frac{W}{L}\left(\frac{5}{16}VDD-V_{th}\right)\frac{2}{16}VDD \quad (14)$$

$$VC3=\frac{1}{4}R\mu_nC_{ox}\frac{W}{L}V_{RF}^2 \quad (15)$$

It may be noticed that, in formulas (13) to (15), since the size variance is neglected, the size variance coefficient K used in formulas (5) to (8) is assumed to be 0. In such case, according to formulas (13) to (15), the index voltage $V_{RF}$ can be calculated by formula (16) as below.

$$V_{RF} = \sqrt{4\left(\frac{3}{16}\right)\left(\frac{2}{16}\right)VDD^2\frac{VC3}{VC1 - VC2}} \quad (16)$$

As a result, the temperature-correlated terms (i.e., the electron mobility $\mu_n$ and the threshold voltage $V_{th}$) can be eliminated during the calculation of the index voltage $V_{RF}$.

In the embodiments shown in FIG. 3 and FIGS. 4A to 4D, the power detector 120 may utilize the detect circuit 122 to perform a plurality of calibration operations in different time period. However, the present disclosure is not limited thereto. In some embodiments, the power detector may include a plurality of detect circuit for performing the calibration operations in parallel.

Figure 5:
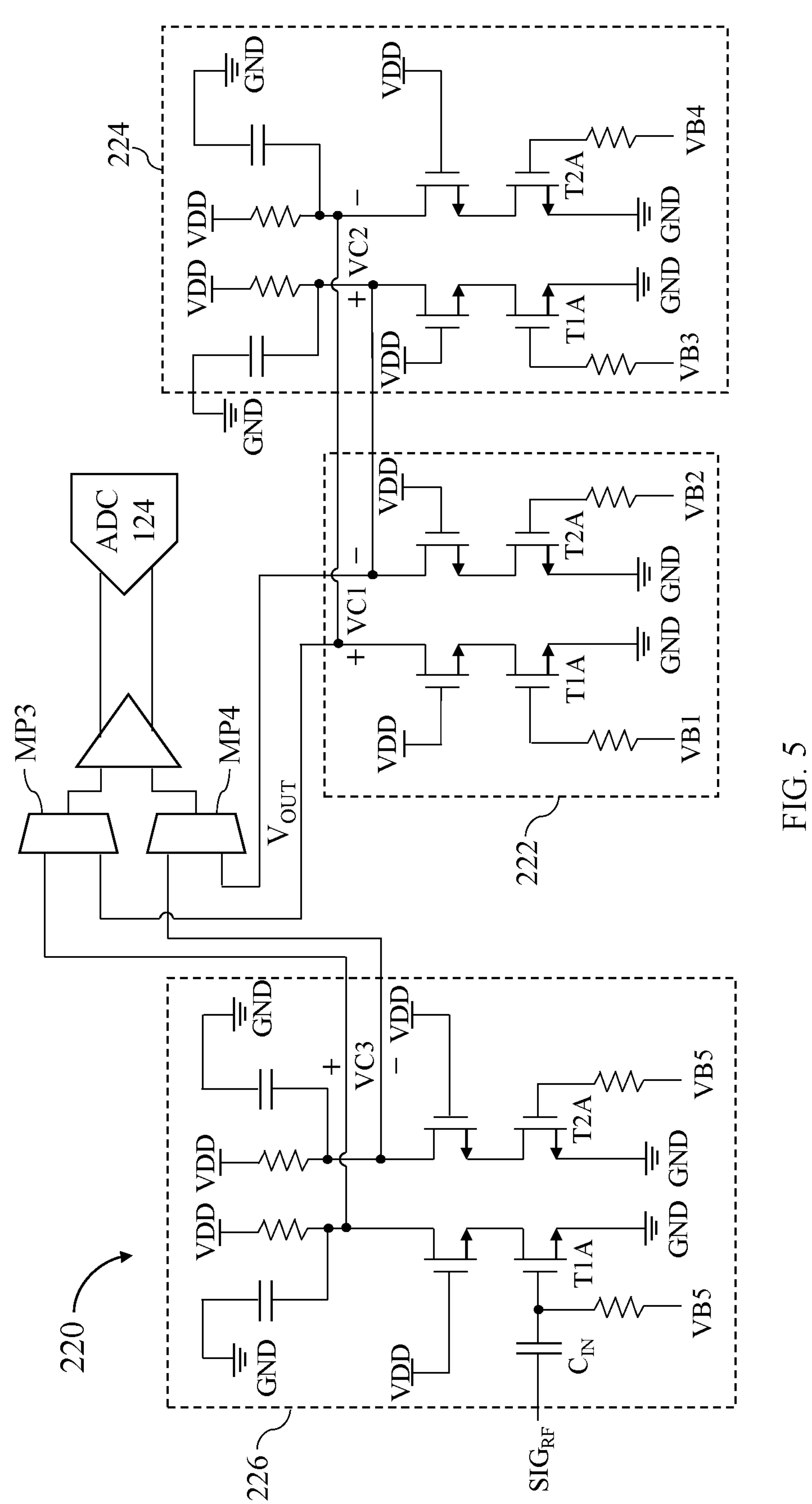
FIG. 5 shows a power detector according to another embodiment of the present disclosure.

FIG. 5 shows a power detector 220 according to another embodiment of the present disclosure. As shown in FIG. 5, the power detector 220 includes detect circuit 222, 224, and 226, and the detect circuits 222, 224, and 226 may have same structures as the detect circuit 122. In the present embodiments, the three calibration operations performed to generate the calibration voltages VC1, VC2, and VC3 shown by formulas (13) to (15) can be performed by the detect circuits 222, 224, and 226 in parallel, and thus, the index voltage $V_{RF}$ can be calculated by the formula (16) accordingly.

In such case, instead of receiving different bias voltage in different time periods for different calibration operations, the detect circuits 222, 224, and 226 may receive fixed bias voltages. For example, the detect circuit 222 may receive the bias voltages VB1

$$VB1\left(\text{e.g., } \frac{7}{16}VDD\right) \text{ and } VB2\left(\text{e.g., } \frac{9}{16}VDD\right),$$

the detect circuit 224 may receive the bias voltages $$VB3\left(\text{e.g., } \frac{4}{16}VDD\right) \text{ and } VB4\left(\text{e.g., } \frac{6}{16}VDD\right),$$

and the detect circuit 226 may receive the bias voltages $$VB5\left(\text{e.g., } \frac{8}{16}VDD\right)$$

and the RF signal $SIG_{RF}$.

Furthermore, in the present embodiment, the calibration voltage VC2 generated by the detect circuit 224 can be subtracted from the calibration voltage VC1 generated by the detect circuit 222 by connecting the output terminals of the detect circuits 222 and 224. As a result, the output voltage $V_{OUT}$ outputted by the detect circuits 222 and 224 as shown in FIG. 5 would be the subtracting result of (VC1-VC2) used in formula (16), therefore, the calculations performed by the DSP 130 can be simplified.

In addition, as shown in FIG. 5, to reuse the ADC 124, a multiplexers MP3 and MP4 can be adopted to select the output of the detect circuit 226 or the output of the detect circuits 222 and 224. However, the present disclosure is not limited thereto.

In summary, the RF device and the method for detecting power of a RF signal provided by the embodiments of the present disclosure can perform a plurality of calibration operations to generate calibration voltages, and calculate the index voltage for indicating the power of the RF signal by performing calculations upon the calibration voltages to reduce temperature dependency. That is, temperature-correlated portions in the index voltage can be reduced, and thus, the power of RF signals can be monitored and controlled more accurately. Accordingly, the power of RF signal outputted from the transmitter chip may be controlled precisely, and a phased array radar system may achieve beamforming with accurate beam steering.

Although the present disclosure and its advantages have been described in detail, it should be understood that various changes, substitutions and alterations can be made herein without departing from the spirit and scope of the disclosure as defined by the appended claims. For example, many of the operations discussed above can be implemented in different methodologies and replaced by other operations, or a combination thereof.

Moreover, the scope of the present application is not intended to be limited to the particular embodiments of the operation, machine, manufacture, composition of matter, means, methods and steps described in the specification. As one of ordinary skill in the art will readily appreciate from the present disclosure, operations, machines, manufacture, compositions of matter, means, methods, or steps, presently existing or later to be developed, that perform substantially the same function or achieve substantially the same result as the corresponding embodiments described herein, may be utilized according to the present disclosure. Accordingly, the appended claims are intended to include within their scope such operations, machines, manufacture, compositions of matter, means, methods, and steps.

What is claimed is:

1. A radio frequency device, comprising:

a power amplifier configured to output a radio frequency (RF) signal;

a power detector configured to receive the RF signal, and perform a plurality of calibration operations to generate a plurality of calibration voltages corresponding to a plurality of bias voltages, wherein the plurality of calibration operations are performed at the plurality of bias voltages respectively, and the plurality of calibration voltages are temperature-correlated due to that electrical characteristics of the power detector are temperature-correlated; and a digital signal processor (DSP) configured to control the power detector to operate at the plurality of bias voltages, obtain an index voltage for indicating power of the RF signal by performing calculations upon the plurality of calibration voltages to reduce temperature dependency of the index voltage, and adjust a gain of the power amplifier according to the index voltage.

2. The radio frequency device of claim 1, wherein the power detector comprises a detect circuit, and the detect circuit comprises:

a first input transistor;

a second input transistor;

a first load unit coupled to the first input transistor and configured to output a first voltage according to a current on the first input transistor; and a second load unit coupled to the second input transistor and configured to output a second voltage according to a current on the second input transistor;

wherein the plurality of the bias voltages are provided to the first input transistor and the second input transistor during the plurality of calibration operations performed in different time periods; and wherein the detect circuit is configured to output a calibration voltage of the plurality of calibration voltages by outputting the first output voltage and the second output voltage as a differential pair.

3. The radio frequency device of claim 2, wherein:

in a first calibration operation, the power detector provides a first bias voltage to a control terminal of the first input transistor and provides a second bias voltage to a control terminal of the second input transistor so as to generate a first calibration voltage of the plurality of calibration voltages;

in a second calibration operation, the power detector provides a third bias voltage to the control terminal of the first input transistor and provides a fourth bias voltage to the control terminal of the second input transistor so as to generate a second calibration voltage of the plurality of calibration voltages;

in a third calibration operation, the power detector provides a fifth bias voltage to the control terminal of the first input transistor and the control terminal of the second input transistor and has the control terminal of the first input transistor receive the RF signal through an input capacitor so as to generate a third calibration voltage of the plurality of calibration voltages; and a difference between the first bias voltage and the second bias voltage is equal to a difference between the third bias voltage and the fourth bias voltage; and a summation of the first bias voltage and the second bias voltage is different from a summation of the third bias voltage and the fourth bias voltage.

4. The radio frequency device of claim 3, wherein:

the first bias voltage is 7 over 16 of a supply voltage of the power detector;

the second bias voltage is 9 over 16 of the supply voltage;

the third bias voltage is 4 over 16 of the supply voltage;

the fourth bias voltage is 6 over 16 of the supply voltage; and the fifth bias voltage is 8 over 16 of the supply voltage.

5. The radio frequency device of claim 4, wherein:

the DSP calculates the index voltage according to a computation result of dividing a product of the third calibration voltage and a square of the supply voltage with the first calibration voltage subtracting the second calibration voltage.

6. The radio frequency device of claim 3, wherein:

in a fourth calibration operation, the power detector provides the fifth bias voltage to the control terminal of the first input transistor and the control terminal of the second input transistor without having the control terminal of the first input transistor receive the RF signal so as to generate a fourth calibration voltage of the plurality of calibration voltages.

7. The radio frequency device of claim 6, wherein:

the first bias voltage is 9 over 16 of a supply voltage of the power detector;

the second bias voltage is 8 over 16 of the supply voltage;

the third bias voltage is 7 over 16 of the supply voltage;

the fourth bias voltage is 8 over 16 of the supply voltage; and the fifth bias voltage is 8 over 16 of the supply voltage.

8. The radio frequency device of claim 7, wherein:

the DSP calculates the index voltage according to a first computation result of the third calibration voltage subtracting the fourth calibration voltage, a second computation result of the first calibration voltage plus the second calibration voltage and subtracting two times the fourth calibration voltage, and a third computation result of dividing a product of the first computation result and a square of the supply voltage with the second computation result.

9. The radio frequency device of claim 2, wherein the first load unit comprises:

a first load transistor having a first terminal configured to output the first voltage, a second terminal coupled to a first terminal of the first input transistor, and a control terminal configured to receive a supply voltage;

a first resistor having a first terminal configured to receive the supply voltage, and a second terminal coupled to the first terminal of the first load transistor; and a first capacitor having a first terminal coupled to a ground, and a second terminal coupled to the second terminal of the first resistor;

wherein a second terminal of the first input transistor and a second terminal of the second input transistor are coupled to the ground.

10. The radio frequency device of claim 1, wherein the power detector comprises a plurality of detect circuits configured to output the plurality of calibration voltages by performing the plurality of calibration operations in parallel.

11. The radio frequency device of claim 1, wherein the power detector further comprises:

an analog to digital converter configured to converting the plurality of calibration voltages into digital calibration voltages so as to allow the DSP to calculate the index voltage according to the digital calibration voltages directly.

12. The radio frequency device of claim 1, wherein the power detector further comprises:

a voltage divider configured to generate the plurality of bias voltages by dividing a supply voltage of the power detector.

13. A semiconductor device comprising:

a power amplifier configured to output a radio frequency (RF) signal; and a power detector configured to receive the RF signal, and perform a plurality of calibration operations to generate a plurality of calibration voltages corresponding to a plurality of bias voltages, wherein the plurality of calibration operations are performed at the plurality of bias voltages respectively, and the plurality of calibration voltages are temperature-correlated due to that electrical characteristics of the power detector are temperature-correlated;

wherein the calibration voltages are configured to calculate an index voltage for indicating power of the RF signal and reduce temperature dependency of the index voltage.

14. A method for detecting power of a radio frequency signal with a power detector, the method comprising:

controlling the power detector to perform a plurality of calibration operations for generating a plurality of calibration voltages according to the RF signal and a plurality of bias voltages, wherein the plurality of calibration voltages are temperature-correlated due to that electrical characteristics of the power detector are temperature-correlated; and obtaining an index voltage for indicating power of the RF signal by performing calculations upon the plurality of calibration voltages to reduce temperature dependency of the index voltage; and adjusting a gain of a power amplifier according to the index voltage;

wherein the plurality of calibration operations are performed at the plurality of bias voltages respectively.

15. The method of claim 14, wherein the power detector comprises a detect circuit, and the detect circuit comprises a first input transistor, a second input transistor, a first load unit, and a second load unit, the step of controlling the power detector to perform the plurality of calibration operations comprises:

controlling the power detector to provide a first bias voltage of the plurality of bias voltages to a control terminal of the first input transistor;

controlling the power detector to provide a second bias voltage of the plurality of bias voltages to a control terminal of the second input transistor;

generating a first output voltage generated by the first load unit according to a current on the first input transistor;

generating a second output voltage generated by the second load unit according to a current on the second input transistor; and obtaining a first calibration voltage of the plurality of calibration voltages by adopting the first output voltage and the second output voltage as a differential pair.

16. The method of claim 15, wherein the step of controlling the power detector to perform the plurality of calibration operations comprises controlling the detect circuit of the power detector to perform the plurality of calibration operations in different time periods.

17. The method of claim 16, wherein the step of controlling the power detector to perform the plurality of calibration operations comprises:

in a first calibration operation, controlling the power detector to provide the first bias voltage to the control terminal of the first input transistor and provide the second bias voltage to the control terminal of the second input transistor so as to generate the first calibration voltage of the plurality of calibration voltages;

in a second calibration operation, controlling the power detector to provide a third bias voltage to the control terminal of the first input transistor and provide a fourth bias voltage to the control terminal of the second input transistor so as to generate a second calibration voltage of the plurality of calibration voltages; and in a third calibration operation, controlling the power detector to provide a fifth bias voltage to the control terminal of the first input transistor and the control terminal of the second input transistor and have the control terminal of the first input transistor receive the RF signal through an input capacitor so as to generate a third calibration voltage of the plurality of calibration voltages;

wherein a difference between the first bias voltage and the second bias voltage is equal to a difference between the third bias voltage and the fourth bias voltage; and wherein a summation of the first bias voltage and the second bias voltage is different from a summation of the third bias voltage and the fourth bias voltage.

18. The method of claim 17, wherein the step of controlling the power detector to perform the plurality of calibration operations further comprises:

in a fourth calibration operation, controlling the power detector to provide the fifth bias voltage to the control terminal of the first input transistor and the control terminal of the second input transistor without having the control terminal of the first input transistor receive the RF signal so as to generate a fourth calibration voltage of the plurality of calibration voltages.

19. The method of claim 15, further comprising:

determining the plurality of bias voltages by satisfying a condition that allows terms related to a threshold voltage and electron mobility of the first input transistor or the second input transistor in the calibration voltages to be canceled out during the step of obtaining the index voltage.

20. The method of claim 14, wherein the power detector comprises a plurality of detect circuits, and the step of controlling the power detector to perform the plurality of calibration operation is performed by the plurality of detect circuits in parallel.

* * * * *